United States Patent [19]
Callahan, Jr.

[11] Patent Number: 6,043,687
[45] Date of Patent: Mar. 28, 2000

[54] INTEGRATED CIRCUIT PRECISION RESISTOR RATIO MATCHING

[75] Inventor: Michael James Callahan, Jr., Austin, Tex.

[73] Assignee: STMicroelectronics, Inc., Carrollton, Tex.

[21] Appl. No.: 09/124,350

[22] Filed: Jul. 29, 1998

[51] Int. Cl.[7] ...................................................... H02P 6/06
[52] U.S. Cl. .............................. 327/73; 327/72; 327/59; 327/538
[58] Field of Search ........................... 327/362, 363, 327/59, 60, 63, 68, 72, 73, 74, 83, 87, 89, 538, 542, 543

[56] References Cited

U.S. PATENT DOCUMENTS

| | | |
|---|---|---|
| 4,849,683 | 7/1989 | Flolid .................................... 323/284 |
| 4,983,955 | 1/1991 | Ham, Jr. et al. ........................ 340/664 |
| 5,446,404 | 8/1995 | Badyal et al. ............................ 327/63 |
| 5,528,017 | 6/1996 | Wolff ...................................... 219/501 |
| 5,585,748 | 12/1996 | Yamaguchi et al. ...................... 327/78 |
| 5,592,112 | 1/1997 | Nishibe .................................... 327/77 |
| 5,757,211 | 5/1998 | Phillips .................................... 327/73 |

Primary Examiner—Timothy P. Callahan
Assistant Examiner—An T. Luu
Attorney, Agent, or Firm—Theodore E. Galanthay; Lisa K. Jorgenson; Renee M. Larson

[57] ABSTRACT

A precision analog circuit ensures precision matching between two or more resistive elements. In order that the two or more resistive elements are truly matched, a first electrical value, such as $V_{DS}$, of the two or more resistive elements are equal and a second electrical value, such as $V_{GS}$, of the two or more resistive elements are equal so that a ratio of the first resistive element to the second resistive element is a predetermined value regardless of the voltage coefficients of the resistive elements.

26 Claims, 3 Drawing Sheets

INTEGRATED CIRCUIT PRECISION RESISTOR RATIO MATCHING

FIELD OF THE INVENTION

The present invention relates generally to precision analog circuits and, more particularly to controllers for controlling a system.

BACKGROUND OF THE INVENTION

In an integrated circuit (IC) used for controlling a system, such as a motor, where two or more integrated resistor dividers produce signals to be compared with each other, accuracy of the comparison depends not only on the matching of the resistor divider diffusions but also on the reverse bias of the junction between the diffused resistors and the silicon into which they are diffused.

Referring now to FIGS. 1A and 1B, the symbol and construction of a diffused resistor used in such an IC will be described.

Referring now to FIG. 1A, the symbol for a diffused resistor 10 is shown, having an isolation pocket or tub tie contact 12 for introducing a bias voltage for controlling the resistance of the diffused resistor 10 between a first resistor contact 14 and a second resistor contact 16.

Referring now to FIG. 1B, the construction of a p type diffused resistor will be described. Reference numerals used in FIG. 1B which are identical, like or similar to reference numerals used in FIG. 1A indicate like or similar components. Diffused resistor of FIG. 1A includes contacts 12, 14, and 16, preferably constructed from a metal. P type diffused resistor 10 is constructed on a p substrate 18 having an n epitaxial layer 20, p+ isolation region 22, and n+ layer 24. Resistor further includes a resistor diffusion of p type material 25 diffused into the n epitaxial layer 20. P resistor diffusion 25 extends from metal contact 14 to metal contact 16. An n+ material 26 is diffused into the n epitaxial layer 20 in abutting engagement with isolation pocket or tub tie contact 12. P type diffused resistor 10 further includes a top silicon dioxide (SiO$_2$)layer 28 and a p resistor diffusion to epitaxial layer junction 27. For proper operation of resistor 10, the n epitaxial layer 20 must be at or above the highest potential of the p resistor diffusion 25 in order to keep the p resistor diffusion to epitaxial layer junction 27 reverse biased. As junction 27 reverse bias increases, a depletion layer forms and moves into p type diffusion 25, reducing the volume of silicon available for use as a resistor and, hence, increasing the resistance value of resistor 10 between contacts 14 and 16.

Referring now to FIGS. 2A and 2B, a prior art control system 30 is shown. Control system 30 includes a system under control 32 having an input 34 and an output 36.

Referring to FIG. 2A, an example of a typical system under control 32 is illustrated. System under control 32 includes a motor 38 having an input 34 and an output 36. Motor 38 includes a position sensor 40 for providing position information signals to output 36.

Referring now to FIG. 2B, input 34 receives a control signal from a controller 42. Controller 42 is an integrated circuit including an output 44 for outputting the control signal to input 34. Controller 42 further includes voltage inputs 46 and 48 for inputting operating voltages V$_{CC}$ and GND, respectively, and a command signal input 50 for entering a command signal to control the system under control 32 via the control signal outputted from output 44. Controller 42 also includes a position feedback signal input 52 for coupling to the output 36 of the system under control 32 for feedbacking a position feedback signal to controller 42. Controller 42 further includes a first resistor divider circuit 54 and a second resistor divider circuit 56. First resistor divider circuit 54 comprises a first diffused resistor R1 (58) and a second diffused resistor R2 (60). Second resistor divider circuit 56 comprises third diffused resistor R3 (62) and fourth diffused resistor R4 (64). In this prior art example, the resistance value of resistor 58 is intended to equal the resistance value of resistor 60, 62, and 64. Resistors 58, 60, 62, and 64 are p type diffused in an n epitaxial layer in a junction isolated technology such as described in connection with FIG. 1.

In the description which follows, reference numerals of parts shown in FIG. 1 will be made to describe the operation of and the construction of resistors 58, 60, 62, and 64. Thus, reference numerals used in the description of FIGS. 2A or 2B which are identical, like or similar to reference numerals used in FIGS. 1A or 1B indicate like or similar components. Controller 42 further includes an error amplifier 66. Error amplifier 66 receives a first voltage signal (V$_1$) from first resistor divider circuit 54 and a second voltage reference signal (V$_2$) from second resistor divider circuit 56 and outputs the control signal via output 44. In this sample control scheme, the system under control 32 comes to rest when the voltage V$_1$ from resistor divider circuit 54 is equal to the voltage V$_2$ from second resistor divider circuit 56. When system under control 32 is at rest the voltage of the command signal added to the voltage of the position feedback signal is equal to V$_{CC}$ or as expressed in the following equation: V$_{COM}$+V$_{FB}$=V$_{CC}$ wherein R1 is equal to R2, and R3 is equal to R4. It will be appreciated that resistor ratio matching is only important as the system under control 32 comes to its resting point. The n+ epitaxial isolation pocket 26 or tub tie contacts 12 of resistors 58, 60 are tied to the highest potential expected on V$_{COM}$ and V$_{FB}$ (V$_{CC}$ in this example), because tub tie contact 12 must be biased at or above the highest potential expected on the p type diffusion 25 of resistors 58, 60 so that junction 27 remains reverse biased. Thus, tub tie contacts 12 of resistors 58, 60 are fixed at V$_{CC}$. In a similar manner, tub tie contact 12 of resistor 62 is fixed at V$_{CC}$. Tub tie contact 12 of resistor 64 is tied to a mutual contact coupling resistors 62, 64, fixing the voltage at a value determined by the ratio of the resistance value of resistor 62 to that of resistor 64. Alternatively, tub tie contact 12 of resistor 64 may also be tied to V$_{CC}$.

For V$_1$=V$_2$ when system 32 comes to rest, V$_{COM}$+V$_{FB}$ must equal V$_{cc}$, and R1/R2−R3/R4 must equal 0. One measure of the error of control system 30 is measured by R1/R2−R3/R4 as a fraction of either R1/R2 or R3/R4.

The following demonstrates the error introduced into control system 30 by the bias voltages applied to tub tie contacts 12, contacts 14, and contacts 16 of resistors 58, 60, 62, 64. The following equations assume that the resistance of a typical resistor varies linearly where R=R$_0$ (1+C$_V$ V$_T$) wherein R$_O$ and C$_V$ are constants and V$_T$=average tub bias voltage=V$_A$−(V$_C$+V$_D$)/2 wherein V$_A$ is the voltage at tub tie contact 12, V$_C$ is the voltage at contact 14, and V$_D$ is the voltage at contact 16. Letting V$_{COM}$=V$_{CC}$, V$_{FB}$=0 v, and V$_1$=V$_2$=Vcc/2, it follows that:

$$R1/R2 = \frac{1 + C_V(V_{CC} - (V_{CC} + V_{CC}/2)/2)}{1 + C_V(V_{CC} - (V_{CC} + 0)/2)}$$

and

-continued $$R3/R4 = \frac{1 + C_V(V_{CC} - (V_{CC} + V_{CC}/2)/2)}{1 + C_V((V_{CC}/2) - (V_{CC}/2 + 0)/2)}.$$

If $C_V$=0.003 and $V_{CC}$=20 v, then R1/R2=0.9713 and R3/R4=1.0000, and the percentage difference between R1/R2 and R3/R4 is 2.9%.

In U.S. Pat. No. 5,757,211, issued May 26, 1998 to William A. Phillips and entitled "IC Precision Resistor Ratio Matching with Different Tub Bias Voltages," an integrated circuit controller having two or more integrated resistor dividers that produce signals to be compared with each other is disclosed. The circuit is designed to substantially reduce the dependency of the comparison of the reverse bias of the junctions between diffused resistors in the integrated resistor dividers and the silicon into which they are diffused.

Referring now to FIG. 3, a control system according to the invention disclosed in U.S. Pat. No. 5,757,211 is disclosed. Reference numerals used in FIG. 3 which are identical, like or similar to reference numerals used in FIGS. 1A, 1B, 2A, or 2B, indicate like or similar components. Control system 130 is identical to control system 30 of FIG. 2B except for the following described differences. Tub tie contact 12 of resistor 164 is coupled to position feedback signal input 52 and command signal input 150 via diodes 170 and 172, respectively. Diodes 170 and 172 collectively act as a switch to bias tub tie contact 12 of resistor 164 with the highest voltage potential of the position feedback signal or command signal. Thus, if $V_{COM}$>$V_{FB}$, then diode 172 couples the command signal to tub tie contact 12 of resistor 164. However, if $V_{FB}$>$V_{COM}$, then diode 170 couples the position feedback signal to tub tie contact 12 of resistor 164. Diode 174 prevents junction 27 of resistor 164 from becoming forward biased. Diodes 170, 172, 174 are ideal diodes with no forward voltage drop. Ibias 168 prevents tub tie contact 12 of resistor 164 from floating high and does not introduce errors. It is to be appreciated that resistor ratio matching (i.e., R1/R2 must equal R3/R4) is required when the system under control 32 comes to rest.

Note that other power supply voltages, resistor diffusions, technologies, and resistor ratios can be used. For example, resistors 58, 60, 62, and 64 may be n type diffused resistors.

The following demonstrates the error introduced into control system 130 by the bias voltages applied to tub tie contacts 12, contacts 14, and contacts 16 of resistors 158, 160, 162, 164 utilizing the same assumptions used for the demonstration of error introduced into control system 30. With $V_{COM}$>$V_{FB}$ and the command signal biasing resistor 164, it follows that:

$$R1/R2 = \frac{1 + C_V(V_{CC} - (V_{com} + V_1)/2)}{1 + C_V(V_{CC} - (V_1 + V_{FB})/2)}$$

and $$R3/R4 = \frac{1 + C_V(V_{CC} - (V_{CC} + V_2)/2)}{1 + C_V(V_{com} - (V_2/2))}.$$

When system 132 is at rest, $V_1$=$V_2$=VCC/2, and $V_{COM}$+$V_{FB}$=$V_{CC}$. Thus, $$R1/R2 = \frac{1 + C_V(V_{CC} - V_{com}/2 - V_{CC}/4)}{1 + C_V(V_{CC} - V_{CC}/4 - V_{CC}/2 + V_{com}/2)}$$

$$= \frac{1 + C_V(3/4V_{CC} - V_{com}/2)}{1 + C_V(1/4V_{CC} + V_{com}/2)}$$

$$R3/R4 = \frac{1 + C_V(V_{CC} - V_{CC}/2 - V_{CC}/4)}{1 + C_V(V_{com} - (V_{CC}/4))} \text{ and}$$

$$= \frac{1 + C_V(1/4V_{CC})}{1 + C_V(V_{com} - (V_{CC}/4))}.$$

Again, with $C_V$=0.003 and $V_{CC}$=20 v, the following table illustrates that the percentage error of R1/R2−R3/R4 is approximately 0.01%.

TABLE 1

ERROR IN CONTROL SYSTEM 130

| $V_{COM}$ | R1/R2 | R3/R4 |
|---|---|---|
| $V_{cc}$ | .9713 | .9713 |
| .9 $V_{cc}$ | .9977 | .9769 |
| .8 $V_{cc}$ | .9827 | .9826 |
| .7 $V_{cc}$ | .9884 | .9883 |
| .6 $V_{cc}$ | .9942 | .9941 |
| .5 $V_{cc}$ | 1.000 | 1.000 |

If $V_{FB}$>$V_{COM}$ and the position feedback signal biases resistor 164, then 0.5 $V_{CC}$ to 0 v will be the mirror image of Table 1.

In summary, by tying the tub tie contact 12 of resistor 164 to a varying rather than fixed voltage signal, such as the command and feedback signals, a substantial reduction (2.9% to 0.01%) in the error introduced by the bias voltages is achieved.

The variation of resistance versus voltage was previously described by the equation: R=R0 (1+$C_V$ $V_T$), which describes a linear voltage coefficient, $C_V$. In actuality, this equation could be more accurately described as: R=R0 (1+$C_1$ $V_T$+$C_2$ $V_T^2$+. . . ). The reason that the higher order terms, i.e. $C_2$ $V_T^2$, exist in this Taylor series expansion is due to the fact that the resistor is acting as a JFET device. As shown in FIG. 4, the width of the depletion region at any point along the length of the resistor is dependent upon the exact voltage potentials at that point from resistor to tub. This potential is a function of the voltage differences between the resistor ends and that of the tub. Considering the resistor to be a JFET device, the two voltage potentials which are important are $V_{DS}$ and $V_{GS}$, respectively.

The tub of n epitaxial layer 20 is biased by the command signal input 150 or the position feedback signal input 152 in order to prevent forward biasing of the resistor and to minimize the voltage coefficient of the resistor. However, the non-linear portion of the resistor voltage coefficients, represented by drain-to-source voltage ($V_{DS}$) and gate-to-source voltage ($V_{GS}$) is not cancelled and therefore some error remains in the comparison of the voltages $V_1$ and $V_2$ by error amplifier 166.

In order to achieve precision control of the system, the ratio of resistors 162 to 164 and resistors 158 to 160 is desired to be exactly one, as previously described. All diffused resistors, including diffused resistors 158, 160, 162, and 164, have a voltage coefficient due to the J-FET nature of the resistors themselves. A similar type of problem can also occur to integrated resistors, either diffused or deposited, due to depletion regions caused by surface fields. This is a MOS-type of effect, and can create resistor non-idealities, particularly for high control gate voltages or for lightly doped resistors. A metal field plate placed over the entire resistor could serve as a top gate voltage of the device; this is in addition to the bottom gate of the device. For either JFET or MOS-type devices, it is critical that $V_{GS}$, in addition to $V_{DS}$, be matched between devices R1, R2 and between R3, R4.

Referring again to FIG. 4, depletion region 200 extends into both the resistor and the tub of the resistor; portion 202 of depletion region 200 extends into tub region 20 and portion 204 of depletion region 200 extends into the diffused resistor portion 25. There are portions of depletion region 200 on either side of junction 27. FIG. 5 illustrates an equivalent circuit of the diffused resistor of FIG. 4, in which the resistor is modeled as a p-channel J-FET, and the N-tub region 25 is the gate of the FET.

The size of portion 204 of depletion region 200 that extends into the resistor diffusion 25 depends upon the doping characteristics of the two regions 202, 204 on either side of junction 27 but also upon the voltage across the resistor, as measured from metal resistor contact 14 to metal resistor contact 16, and also upon the voltage from tub tie 12 to the resistor. As is well known in the art, depletion region 200 grows non-linearly with voltage as a function of the doping concentration of junction 27. Because the resistor is more heavily doped than the tub, the J-FET affect is small, and the depletion region is mostly in the tub and not in the resistor itself, as shown in FIG. 4. Nevertheless, the portion 204 of depletion region 200 that lies in the resistor is responsible for the error, albeit only 0.01%, introduced by the bias voltages: command signal input 150 or position feedback signal input 152 and tub tie voltages.

Consider, by way of example, the following analysis of FIG. 3, in which VCC is 20 volts, command signal input 150 is 12 volts, position feedback signal input 152 is 8 volts, and the V1 and V2 inputs to error amplifier 166 are each 10 volts. According to these voltages, Table 2 below contain certain voltages of resistors 158, 160, 162, and 164, assuming otherwise ideally matched resistors at zero bias.

TABLE 2

RESISTOR VOLTAGES

| Resistor | Hi End (source) | Low End (drain) | Tub (gate) | $V_{DS}$ | $V_{GS}$ |
|---|---|---|---|---|---|
| R1 (158) | 10 v | 8 v | 20 v | −2 v | 10 v |
| R2 (160) | 12 v | 10 v | 20 v | −2 v | 8 v |
| R3 (162) | 20 v | 10 v | 20 v | −10 v | 0 v |
| R4 (164) | 10 v | 0 v | 12 v | −10 v | 2 v |

This table demonstrates that the steering circuit comprised of diodes D0 and D1 allow resistor R4 to have a value that is closer to the value of resistor R3 than in the previous art. In spite of the improvement, however, it is nonetheless clear that resistor R1 158 is still not matched to resistor R2 160 and that resistor R3 162 is not matched to resistor R4 164 because $V_{GS}$ for the resistors are not matched. This means that the depletion region that encroaches into each resistor portion will be different and therefore create an error in the resistor matching.

In order to reduce the error that is due to the finite voltage coefficients of the resistors as much as possible, the bias voltages (VDS, VGS) associated with each resistor must be matched. There is therefore an unmet need in the art to provide an integrated circuit controller that provides as close to a zero error of bias signals as possible based upon the ratio matching of resistor divider diffusions.

SUMMARY OF THE INVENTION

It is an object of the present invention to ensure precision matching between two or more diffused resistors so that a ratio of the diffused resistors is equal to a predetermined value, such as unity.

It is furthermore an object of the present invention to ensure that the non-linear portion of the resistor voltage coefficients of the two or more diffused resistors, in addition to the linear portions of the resistor voltage coefficients, be cancelled in order to ensure that the diffused resistors are matched.

Therefore, according to the present invention, a precision analog circuit ensures precision matching between two or more resistive elements. A first resistive divider of the circuit has first and second resistive elements coupled together to generate a first voltage that is supplied to a comparison element such as an error amplifier. The first and second resistive elements are characterized by voltage coefficients, Cv. A second voltage is supplied to the comparison element and the comparison element generates a signal indicative of a voltage difference between the first and second voltage. A feedback element coupled to the comparison element operates to reduce the voltage difference, if any, to zero. The circuit operates to control a first terminal difference, such as $V_{DS}$, to be of equal value for both the first and second resistive elements to be equal in value; likewise, the circuit operates to ensure that a second terminal difference, such as $V_{GS}$, is the same value for both the first and second resistive elements. In this way, precision matching between the first and second resistive elements is obtained regardless of their voltage coefficients.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1A:
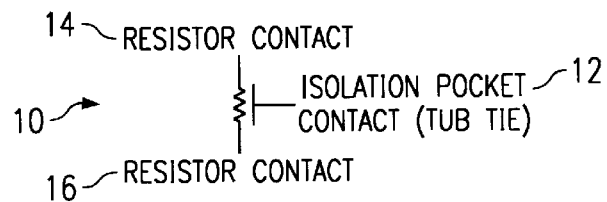
FIG. 1A illustrates the circuit symbol for a diffused resistor utilized in the present invention.
Figure 1B:
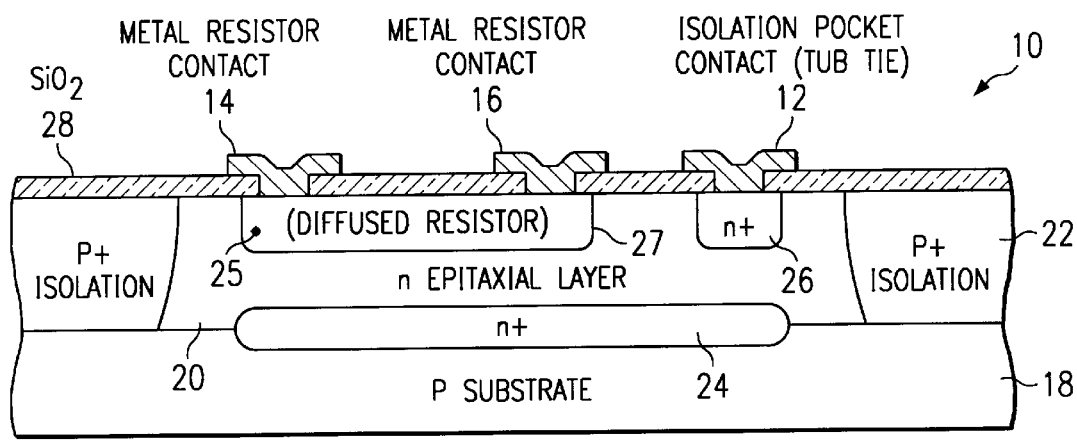
FIG. 1B illustrates an example of the construction of a diffused resistor symbolized in FIG. 1A and utilized in the present invention.
Figure 2A:
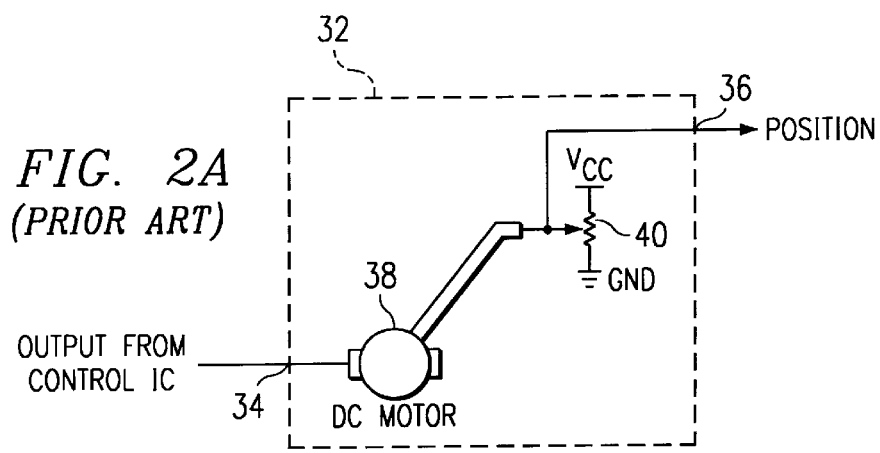
FIG. 2A illustrates a typical system to be controlled in the present invention.
Figure 2B:
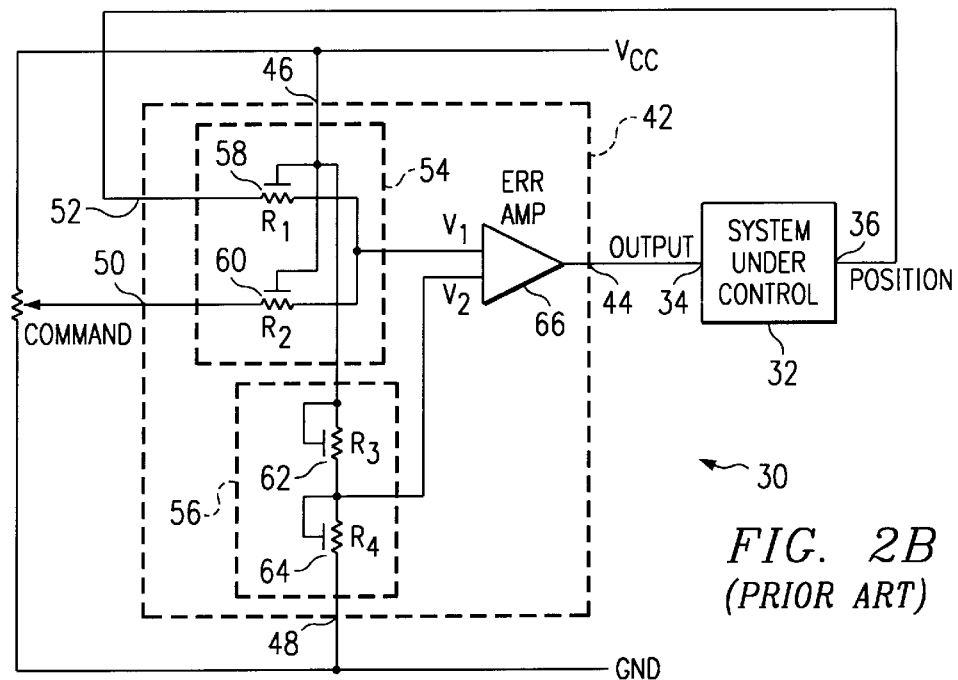
FIG. 2B illustrates a prior art control system for controlling the system depicted in FIG. 2A.
Figure 3:
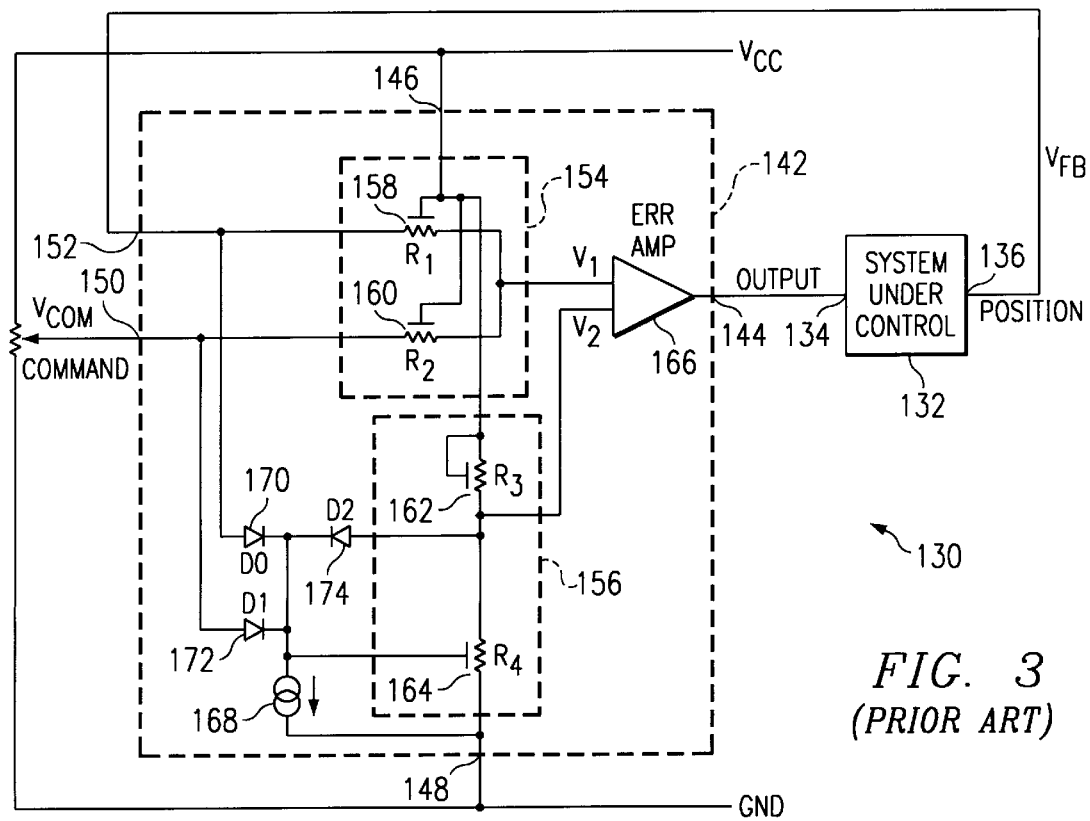
FIG. 3 illustrates a prior art control system for controlling the system depicted in FIG. 2A.
Figure 4:
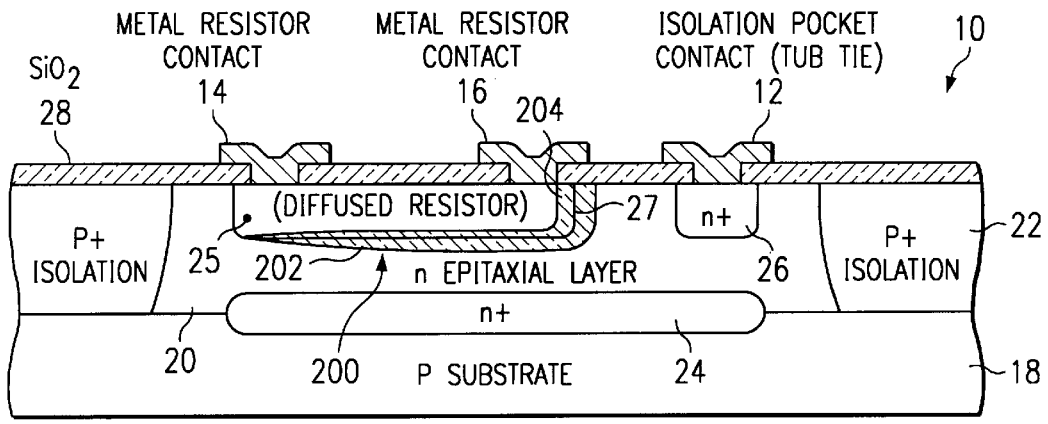
FIG. 4 illustrates a depletion region of the diffused resistor illustrated in FIG. 1B.
Figure 5:
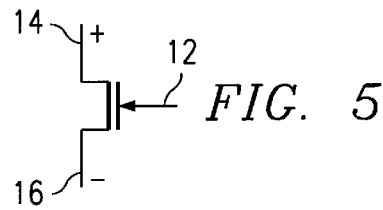
FIG. 5 illustrates an equivalent circuit of the diffused resistor illustrated in FIG. 4.
Figure 6:
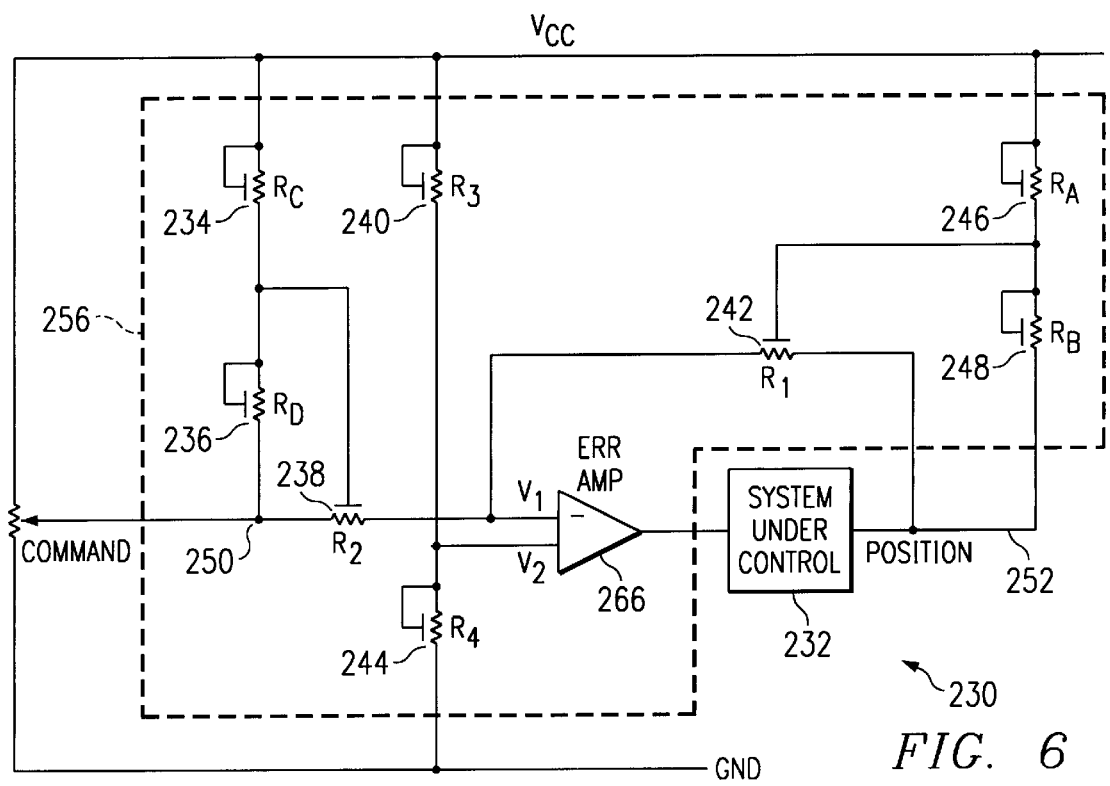
FIG. 6 illustrates a control system for controlling a system of the type depicted in FIG. 2A, according to the present invention.

Referring now to FIG. 6, a controller 256 according to the present invention is shown. This controller differs from controller 156 of FIG. 3 in that it operates to ensure that matched resistors R1, R2 and R3, R4 both have the same VGS as well as VDS and are therefore truly matched.

Controller 256 contains the following elements: resistors 234, 236, 238, 240, 242, 244, 246, 248 and error amplifier 266. Resistor matching between resistors 238, 242 and between resistors 240, 244 is required for proper operation of the controller when system under control 232 comes to rest. The system under control 232 comes to rest when voltage V1 produced at the node between resistors 238 and 242 is equal to the voltage V2 produced by the voltage divider formed by resistors 240 and 244. R1 must equal R2 and R3 must equal R4 for the system to be accurately positioned at rest.

The resistor matching required of resistors 240 and 244 is ensured by the voltage divider they form between supply voltage Vcc and reference ground. The tub tie of resistor 240 is tied to supply voltage Vcc and the tub tie of resistor 244 is tied to the node between resistors 240, 244 as shown. The voltage at the node is fixed and always provided to non-inverting input of error amplifier 266. However, the voltage divider formed by resistors 234, 236 and the voltage divider formed by resistors 246, 248 are necessary to ensure that R1 will match R2 when the system under control 232 comes to rest. The tub tie of resistor R2 (238) is coupled to the voltage produced by the voltage divider of resistors 234, 236 and the tub tie of resistor R1 (242) is coupled to the voltage produced by the voltage divider formed by resistors 246, 248. The tub ties of resistors RA–RD are coupled as shown.

In order for the voltage dividers forms by resistors RA–RD to operate properly, resistor RC (234) must be equal in value to resistor RD (236). Likewise, resistor RA (246) must be equal in value to resistor RB (248). It is also preferable that resistors RA–RD be large in value so as not to consume an excessive amount of power. Additionally, resistors RC, RD are driven by command signal input 250 and therefore must be chosen to be significantly larger than any resistance associated with the potentiometer associated with command signal input 250 or otherwise compensated in known ways. One will appreciate that the particular value chosen for these resistors may of course vary given such considerations as the amplifiers of a driving circuit driving controller 256 and how much power it is advisable to consume given the particular system under control 252. By way of example, in a bi-polar application 10 k Ω may be a good value for resistors 234–248 while in a CMOS environment 100 k Ω may be a good value.

The benefits of the present invention may be best illustrated by way of example. Assume that the following conditions exist for the controller 256 of FIG. 6. Vcc is 20 volts, the V1 and V2 inputs to error amplifier 266 are each 10 volts, command signal input 250 is 12 volts, and position feedback signal input 252 is 8 volts. The voltage produced at the node between resistors 246 and 248 is 14 volts, while the voltage produced at the node between resistors 234 and 236 is 16 volts. Table 3 below contains the values of certain properties of R1–R4 resistors (238, 240, 242, and 244) for these voltages.

TABLE 3

RESISTOR VOLTAGES

| Resistor | Hi End (source) | Low End (drain) | Tub (gate) | $V_{DS}$ | $V_{GS}$ |
|---|---|---|---|---|---|
| R1 (242) | 10 v | 8 v | 14 v | −2 v | 4 v |
| R2 (238) | 12 v | 10 v | 16 v | −2 v | 4 v |
| R3 (240) | 20 v | 10 v | 20 v | −10 v | 0 v |
| R4 (244) | 10 v | 0 v | 10 v | −10 v | 0 v |

It is quite clear from Table 3 that the present invention operates to not only ensure that $V_{DS}$ between matched transistors is the same but that $V_{GS}$ is as well. In this way, the present invention ensures that resistor R1 is truly matched to R2 and that resistor R3 is truly matched to R4. Thus, control system 230 is immune from any error introduced by any bias voltage, such as command signal input 250 or position feedback signal 252, applied to R1–R4 resistors 238–244.

The system under control 232 and command signal input 250 while shown in FIG. 6 are not required for the operation of controller 256. System under control 232 is provided simply to illustrate how controller 256 may be used to control such a system.

It is important to note that the present invention is equally applicable to applications in which there is concern with the depletion region of the diffused resistor moves into the bottom of the resistor, as described above, and applications in which there is concern with the depletion region coming in from the surface of the device. Such applications in which the depletion region is coming from the surface would include, but are not limited to, lightly doped resistors, resistors subjected to high voltage, and/or incredibly thin devices of the type to be found in thin film transistor (TFT) technology.

While the invention has been particularly shown and described with reference to a preferred embodiment, it will be understood by those skilled in the art that various changes in form and detail may be made therein without departing from the spirit and scope of the invention.

What is claimed is:

1. A circuit that ensures precision matching between two or more resistive elements, comprising:

a first resistive divider comprised of a first resistive element and a second resistive element that generates a first voltage, wherein the first resistive element and the second resistive element each have a first terminal, a second terminal, and a third terminal and are each characterized by a voltage coefficient;

a comparison element that is provided with the first voltage generated by the first resistive divider and a second voltage, compares the first voltage to the second voltage, and generates an error signal indicative of a voltage difference between the first voltage and the second voltage;

a feedback means coupled to the comparison element;

wherein a first terminal difference of the first resistive element is controlled to be equal to a first terminal difference of the second resistive element and a second terminal difference of the first resistive element is controlled to be equal to a second terminal difference of the second resistive element, so that a ratio of the first resistive element to the second resistive element is a first predetermined value, wherein the first terminal difference of the first resistive element is defined as the difference in voltage between a voltage at the first terminal of the first resistive element and a voltage at the second terminal of the first resistive element, the first terminal difference of the second resistive element is defined as the difference in voltage between a voltage at the first terminal of the second resistive element and a voltage at the second terminal of the second resistive element, the second terminal difference of the first resistive element is defined as the difference in voltage between the voltage at the first terminal of the first resistive element and a voltage at the third terminal of the first resistive element, and the second terminal difference of the second resistive element is defined as the difference in voltage between the voltage at the first terminal of the first resistive element and a voltage at the third terminal of the second resistive element.

2. The circuit of claim 1, further comprising:
a second resistive divider, comprised of a third resistive element and a fourth resistive element, that generates the second voltage, wherein the third resistive element and the fourth resistive element each have a first terminal, a second terminal, and a third terminal and are each characterized by a voltage coefficient.

3. The circuit of claim 1, wherein the first predetermined value is unity.

4. The circuit of claim 1, wherein the first terminal difference is drain-to-source voltage $V_{DS}$.

5. The circuit of claim 1, wherein the second terminal difference is gate-to-source voltage $V_{GS}$.

6. The circuit of claim 1, wherein the comparison element is an error amplifier.

7. The circuit of claim 1, wherein the first resistive element and the second resistive element are each characterized by a voltage coefficient and the ratio of the first resistive element to the second resistive element is the first predetermined value regardless of the voltage coefficient of the first resistive element or the voltage coefficient of the second resistive element.

8. The circuit of claim 1, wherein the feedback means operatively drives the voltage difference between the first voltage and the second voltage toward a second predetermined value.

9. The circuit of claim 8, wherein the second predetermined value is zero.

10. A circuit that ensures precision matching of electrical values between two or more resistive elements, comprising:
a comparison element that receives a first voltage and a second voltage, is operable upon an error signal indicative of a difference between the first voltage and the second voltage, and generates a signal;
a first resistive element, wherein the first resistive element is coupled to the comparison element and receives the signal generated by the comparison element and operatively drives the difference between the first voltage and the second voltage towards zero; and
a second resistive element coupled to the first resistive element at a first node to produce the first voltage at the first node, wherein said first voltage is representative of a first resistive ratio between the first resistive element and the second resistive element, wherein the first resistive element and the second resistive element are characterized by a first electrical value and a second electrical value;
wherein when the first resistive ratio is equal to a first predetermined value and the second resistive ratio is equal to the first predetermined value, the first electrical value of the first resistive element is equal to the first electrical value of the second resistive element and the second electrical value of the first resistive element is equal to the second electrical value of the second resistive element.

11. The circuit of claim 10, wherein the comparison element is an error amplifier.

12. The circuit of claim 10, wherein the first predetermined value is unity.

13. The circuit of claim 10, wherein the first electrical value is drain-to-source voltage $V_{DS}$.

14. The circuit of claim 10, wherein the second electrical value is gate-to-source voltage $V_{GS}$.

15. The circuit of claim 10, wherein the comparison element is an error amplifier.

16. The circuit of claim 10, wherein the circuit further comprises:
a third resistive element coupled to a supply voltage; and
a fourth resistive element coupled to a reference voltage and coupled to the third resistive element at a second node to form a first voltage divider that generates the second voltage as a first divided voltage that is representative of a second resistive ratio between the third resistive element and the fourth resistive element, wherein the third resistive element and the fourth resistive element each are characterized by a first electrical value and a second electrical value;
wherein when the first resistive ratio is equal to the first predetermined value and the second resistive ratio is equal to the first predetermined value, the first electrical value of the third resistive element is equal to the first electrical value of the fourth resistive element, and the second electrical value of the third resistive element is equal to the second electrical value of the fourth resistive element, and the difference between the first resistive ratio and the second resistive ratio is zero.

17. The circuit of claim 16, wherein the circuit further comprises:
a second voltage divider coupled to the supply voltage and the second resistive element, wherein the second voltage divider produces a second divided voltage that is provided to a tub tie of the second resistive element;
a third voltage divider coupled to the supply voltage, the comparison element, and the first resistive element, wherein the third voltage divider produces a third divided voltage that is provided to a tub tie of the first resistive element;
wherein a tub tie of the third resistive element is coupled to the supply voltage and a tub tie of the fourth resistive element is coupled to the second node.

18. The circuit of claim 10, wherein the first resistive element operatively drives the difference between the first voltage and the second voltage toward a second predetermined value.

19. The circuit of claim 18, wherein the second predetermined value is zero.

20. A method for ensuring precision matching between two or more resistive elements, comprising:
comparing a first voltage generated by a first resistive divider, comprised of a first resistive element and a second resistive element, and a second voltage;
generating a signal indicative of a difference between the first voltage and the second voltage;
operatively driving the voltage difference between the first voltage and the second voltage toward a first predetermined value; and
controlling a first terminal difference of the first resistive element to be equal to a first terminal difference of the second resistive element and controlling a second terminal difference of the first resistive element to be equal to a second terminal difference of the second resistive element, so that a ratio of the first resistive element to the second resistive element is a second predetermined value.

21. The method of claim 20, wherein the first resistive element and the second resistive element each have a first terminal, a second terminal, and a third terminal and are each characterized by a voltage coefficient and the ratio of the first resistive element to the second resistive element is the second predetermined value regardless of the voltage coefficient of the first resistive element or the voltage coefficient of the second resistive element, and wherein the first terminal difference of the first resistive element is defined as the difference in voltage between a voltage at the first terminal of the first resistive element and a voltage at the second terminal of the first resistive element, the first terminal difference of the second resistive element is defined as the difference in voltage between a voltage at the first terminal of the second resistive element and a voltage at the second terminal of the second resistive element, the second terminal difference of the first resistive element is defined as the difference in voltage between the voltage at the first terminal of the first resistive element and a voltage at the third terminal of the first resistive element, and the second terminal difference of the second resistive element is defined as the difference in voltage between the voltage at the first terminal of the first resistive element and a voltage at the third terminal of the second resistive element.

22. The method of claim 20, wherein the second voltage is generated by a second resistive divider, comprising:

a third resistive element; and a fourth resistive element coupled to the third resistive element, wherein the third resistive element and the fourth resistive element each have a first terminal, a second terminal, and a third terminal and are each characterized by a voltage coefficient.

23. The circuit of claim 20, wherein the second predetermined value is unity.

24. The circuit of claim 20, wherein the first terminal difference is drain-to-source voltage $V_{DS}$.

25. The circuit of claim 20, wherein the second terminal difference is gate-to-source voltage $V_{GS}$.

26. The circuit of claim 20, wherein the first predetermined value is zero.

* * * * *